United States Patent
Bal

(10) Patent No.: US 11,689,191 B2
(45) Date of Patent: Jun. 27, 2023

(54) HIGH FREQUENCY RESOLUTION DIGITAL SINUSOID GENERATOR

(71) Applicant: STMicroelectronics International N.V., Geneva (CH)

(72) Inventor: Ankur Bal, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/673,214

(22) Filed: Feb. 16, 2022

(65) Prior Publication Data

US 2022/0321111 A1 Oct. 6, 2022

Related U.S. Application Data

(60) Provisional application No. 63/167,858, filed on Mar. 30, 2021.

(51) Int. Cl.
*H03K 5/00* (2006.01)
*H03K 5/02* (2006.01)

(52) U.S. Cl.
CPC ..... *H03K 5/02* (2013.01); *H03K 2005/00078* (2013.01)

(58) Field of Classification Search
CPC ............ H03K 5/02; H03K 2005/00078; G06F 1/0321
USPC ........................................................ 327/291
See application file for complete search history.

(56) References Cited

U.S. PATENT DOCUMENTS

| | | | |
|---|---|---|---|
| 4,573,070 A * | 2/1986 | Cooper | H04N 5/144 348/610 |
| 4,992,743 A | 2/1991 | Sheffer | |
| 4,998,072 A | 3/1991 | Sheffer | |
| 5,031,131 A | 7/1991 | Mikos | |
| 5,459,680 A | 10/1995 | Zimmerman et al. | |
| 5,467,294 A | 11/1995 | Hu et al. | |
| 5,708,687 A | 1/1998 | Powell et al. | |
| 7,047,264 B2 * | 5/2006 | Kishi | H03H 17/0664 375/350 |
| 7,054,088 B2 * | 5/2006 | Yamazaki | G11B 20/18 |
| 7,327,816 B2 | 2/2008 | Messier | |
| 7,518,894 B2 * | 4/2009 | Fosler | H02J 1/08 363/72 |
| 7,702,707 B2 | 4/2010 | Thomas et al. | |

(Continued)

OTHER PUBLICATIONS

Al-Ibrahim, M. M.: "A new hardware-efficient digital sinusoidal oscillator with low- and uniform-frequency spacing," Electrical Engineering 85 (2003) 255-260, Springer-Verlag 2003.

(Continued)

*Primary Examiner* — Ryan Jager
(74) *Attorney, Agent, or Firm* — Crowe & Dunlevy

(57) ABSTRACT

A delay circuit applies a one sample delay to a first digital sinusoid signal and outputs a delayed digital sinusoid signal. The first digital sinusoid signal and the delayed digital sinusoid signal are then added to each other by an adder circuit to generate an added digital sinusoid signal. A gain scaling circuit applies a scaling factor to the added digital sinusoid signal to generate a second digital sinusoid signal. Samples of the first and second digital sinusoid signals are alternately selected by a multiplexing circuit to generate a third digital sinusoid signal having twice as many samples as the first digital sinusoid signal over a same sinusoid period.

38 Claims, 5 Drawing Sheets

(56) References Cited

U.S. PATENT DOCUMENTS

| | | | |
|---|---|---|---|
| 7,844,650 B2 | 11/2010 | Warner et al. | |
| 7,890,562 B2 * | 2/2011 | Gross | G06F 1/0356 |
| | | | 708/276 |
| 8,325,834 B2 * | 12/2012 | Sakoda | H04L 5/023 |
| | | | 375/343 |
| 8,694,569 B2 * | 4/2014 | Willson, Jr. | H04L 27/0002 |
| | | | 708/319 |
| 8,924,452 B2 * | 12/2014 | Lei | G06F 17/141 |
| | | | 708/405 |
| 9,312,467 B2 | 4/2016 | Kim | |
| 9,407,203 B2 | 8/2016 | Lee | |
| 9,772,972 B2 * | 9/2017 | Pagnanelli | G06F 17/147 |
| 11,163,022 B2 * | 11/2021 | Daubert | G01R 33/077 |
| 2019/0384347 A1 | 12/2019 | Bal et al. | |
| 2022/0321111 A1 * | 10/2022 | Bal | H03K 5/02 |

OTHER PUBLICATIONS

Dhillon, Harpreet Singh, et al: "A Low Power Architecture of Digital Sinusoid Generator using Cubic Spline Interpolation," ISSN: (Print) 0974-7338 (Online) IETE Journal of Education, homepage: http://www.tandfonline.com/loi/tije20.

Flanagan, Michael J.: "Reduced-Complexity Digital Sinusoid Generators and Oversampled Data Converters," California Institute of Technology, 1995.

Lin, Meng-Hsueh, et al.: "An Efficient Pipeline Direct Digital Frequency Synthesizer Based on a Novel Interpolation Algorithm," ECCTD'01—European Conference on Circuit Theory and Design, Aug. 28-31, 21001, Espoo, Finland.

* cited by examiner

HIGH FREQUENCY RESOLUTION DIGITAL SINUSOID GENERATOR

CROSS-REFERENCE TO RELATED APPLICATIONS

This application claims the priority benefit of U.S. Provisional Application for Patent No. 63/167,858, filed Mar. 30, 2021, the disclosure of which is incorporated by reference.

TECHNICAL FIELD

Embodiments herein generally relate to the generation of a sinusoid signal and, in particular, to a digital sinusoid generator having a high frequency resolution.

BACKGROUND

Reference is made to FIG. 1 which shows a block diagram of a conventional digital sinusoid (sine or cosine) generator 10. A sine/cosine lookup table (LUT) 12 stores a plurality of digital values which represent discrete samples 13 of the magnitude of a sinusoid having a certain base frequency fb and sampled at a certain sampling frequency fs. This is represented, by example only, in the illustration of FIG. 2 for a sinusoid 15 having been sampled to produce N discrete samples 13 over one period T=1/fb where fs=N*fb. The discrete digital values for those samples stored in the sin/cos LUT 12 are accessed for output one at a time at a rate set by a clock signal CLK having a frequency fclk in response to a multi-bit (for example, a-bit) tuning signal 14 and a multi-bit (for example, b-bit) amplitude signal 16 to generate a digital sinusoid signal 18. The frequency fclk may, in an example implementation, equal the sampling frequency fs. In the discrete domain, the digital sinusoid signal 16 output from the sin/cos LUT 12 is a multi-bit (for example, c-bit) digital signal of the form: $x_{sin}(n)=A \sin(2\pi nk/N)$, wherein A is the amplitude of the sinusoid selected by amplitude signal 16, n is the digital signal index to access the lookup table, and k is the frequency tuning value provided by the tuning signal 14. In the time domain, this digital sinusoid signal ideally corresponds to $x(t)=A \sin(\omega t)$.

As a representative, but not limiting, example, the number of bits in the multi-bit digital signals may be: a=7 bits, b=8 bits and c=16 bits, for a tunable sinusoid generator with 256 stored samples that outputs a 16-bit word with 127 tunable sinusoid frequencies.

The frequency f sin of the output digital sinusoid signal 16 is equal to the frequency of the clock signal (fclk) divided by the number of samples for one period which are accessed from the sin/cos LUT 12. The tuning signal 14 is used to set the frequency f sin of the digital sinusoid signal $x_{sin}(n)$ by controlling the number of accessed samples. The tuning value k for the signal 14 is set by a tuner circuit 20. By increasing the value of k, fewer of the N samples in the sin/cos LUT 12 are accessed and the frequency f sin is increased (given a fixed frequency fclk for the clock signal CLK). For example, where k=1, all N samples from 0 to N−1 stored in the sin/cos LUT 12 are sequentially accessed at the frequency of the clock signal CLK and output to generate the digital sinusoid signal $x_{sin}(n)$ at the frequency f sin=fclk/N. For k=2, however, only one-half (i.e., N/2) of the N samples from the sin/cos LUT 12 are sequentially accessed at the same frequency of the clock signal CLK (by taking only the even numbered samples, for example, as specified by the term "nk") and output to generate the digital sinusoid signal $x_{sin}(n)$ at the frequency f sin=2*fclk/N (which is double the frequency for k=1).

The permitted range of values for k in tuning the frequency of the generated digital sinusoid is limited by the Nyquist criteria to the range of 0 to (N−1)/2. This puts a significant constraint on the ability of the circuit 10 to generate digital sinusoids of different frequency. Indeed, frequency resolution with the circuit 10 is limited by the number of available samples N stored in the sin/cos LUT 12. This issue could be addressed by increasing the size of the sin/cos LUT 12 with a corresponding increase in the number of stored samples N. However, this requires use of a larger memory and in many circuit applications the use of such a larger memory for the sin/cos LUT 12 is not possible due to one or more considerations such as: occupied circuit area, power, temperature, etc. There accordingly exists a need in the art to improve the frequency resolution of a sin/cos LUT-based digital sinusoid generator without having to increase the memory size (i.e., the number of samples stored in the LUT).

SUMMARY

In an embodiment, a digital circuit comprises: an input configured to receive a first digital sinusoid signal; a first delay circuit configured to apply a delay to the first digital sinusoid signal to generate a first delayed digital sinusoid signal; a first adder circuit configured to add the first digital sinusoid signal to the first delayed digital sinusoid signal to generate a first added digital sinusoid signal; a first gain scaling circuit configured to apply a first scaling factor to the first added digital sinusoid signal to generate a second digital sinusoid signal; and a selection circuit configured to repeatedly select samples from both the first and second digital sinusoid signals and generate an output digital sinusoid signal.

In an embodiment, a sinusoid generator circuit comprises: an input configured to receive a first digital sinusoid signal having a time domain representation corresponding to A $\sin(\omega t)$; a processing circuit coupled to said input and configured to generate from said first digital sinusoid signal a second digital sinusoid having a time domain representation corresponding to A $\sin(\omega t+\alpha/2)$; wherein a is a phase shift equal to one sample of the first digital sinusoid signal; and a selection circuit having first and second inputs configured to receive the first and second digital sinusoid signals, respectively, said multiplexer circuit configured to repeatedly and sequentially select samples of the first and second digital sinusoid signals to generate a third digital sinusoid signal.

In an embodiment, a sinusoid generator circuit comprises: an input configured to receive a first digital sinusoid signal having a discrete domain representation of A $\sin(2\pi n/N)$, where n is an index for samples and N is a total number of samples in one sinusoid period; a processing circuit coupled to said input and configured to generate from said first digital sinusoid signal a second digital sinusoid having a discrete domain representation corresponding to A $\sin(2\pi(n-(\frac{1}{2}))/N)$; and a selection circuit having first and second inputs configured to receive the first and second digital sinusoid signals, respectively, said multiplexer circuit configured to repeatedly and sequentially select samples of the first and second digital sinusoid signals to generate a third digital sinusoid signal.

In an embodiment, a method comprises: receiving a first digital sinusoid signal; delaying the first digital sinusoid signal to produce a delayed digital sinusoid signal; adding the first digital sinusoid signal to the delayed digital sinusoid signal to generate an added digital sinusoid signal; apply a scaling factor to the added digital sinusoid signal to generate a second digital sinusoid signal; and repeatedly and sequentially selecting samples from the first and second digital sinusoid signals to generate a third digital sinusoid signal.

BRIEF DESCRIPTION OF THE DRAWINGS

For a better understanding of the embodiments, reference will now be made by way of example only to the accompanying figures in which.

DETAILED DESCRIPTION

A solution to the problem noted above provides an increase in the frequency resolution of a sine lookup table (LUT) based digital sinusoid generator without having to increase the size of the memory or number of stored samples for the LUT. This solution takes advantage of the following mathematical relationship:

$$A\sin(\omega t) + A\sin(\omega t + \alpha) = 2A\cos(\alpha/2)\sin(\omega t + \alpha/2) \quad \text{(Eq. 1)}$$

where $\alpha$ is a phase shift.

The term $2\cos(\alpha/2)$ is a constant dependent only on the magnitude of the phase shift $\alpha$. This constant can be eliminated by an appropriate mathematical scaling operation:

$$2A\cos(\alpha/2)\sin(\omega t + \alpha/2) * 1/(2\cos(\alpha/2)) = A\sin(\omega t + \alpha/2) \quad \text{(Eq. 2)}$$

where $1/(2\cos(\alpha/2))$ is the scaling factor used to cancel the phase-dependent constant value.

So, through a gain scaling of the sum of two phase shifted (by $\alpha$) sinusoids, a sinusoid $A\sin(\omega t + \alpha/2)$ can be generated.

By properly selecting the phase shift a in the digital domain, digital samples of $A\sin(\omega t + \alpha/2)$ can be positioned between consecutive digital samples of $A\sin(\omega t)$. An alternating selection in the digital domain between the digital samples of $A\sin(\omega t)$ and the digital samples of $A\sin(\omega t + \alpha/2)$ can then be made to generate a digital sinusoid having twice the number of samples within a same period and thus having double the frequency resolution.

Figure 1:
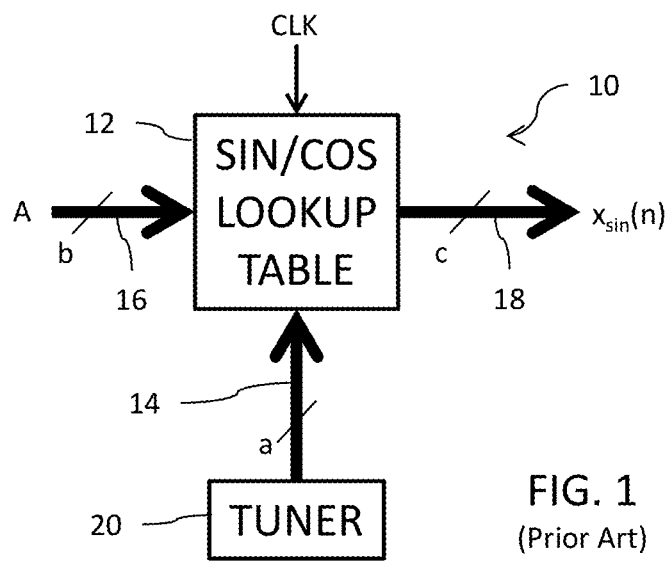
FIG. 1 is a block diagram of a conventional digital sinusoid (sine or cosine) generator.
Figure 2:
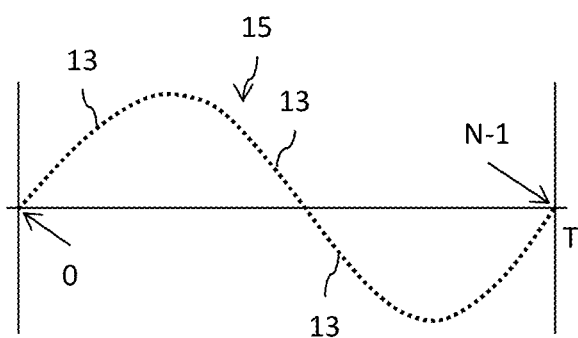
FIG. 2 illustrate the sampling of a sinusoid to generate discrete digital values for a sine lookup table (LUT) as used in the circuit of FIG. 1.
Figure 3:
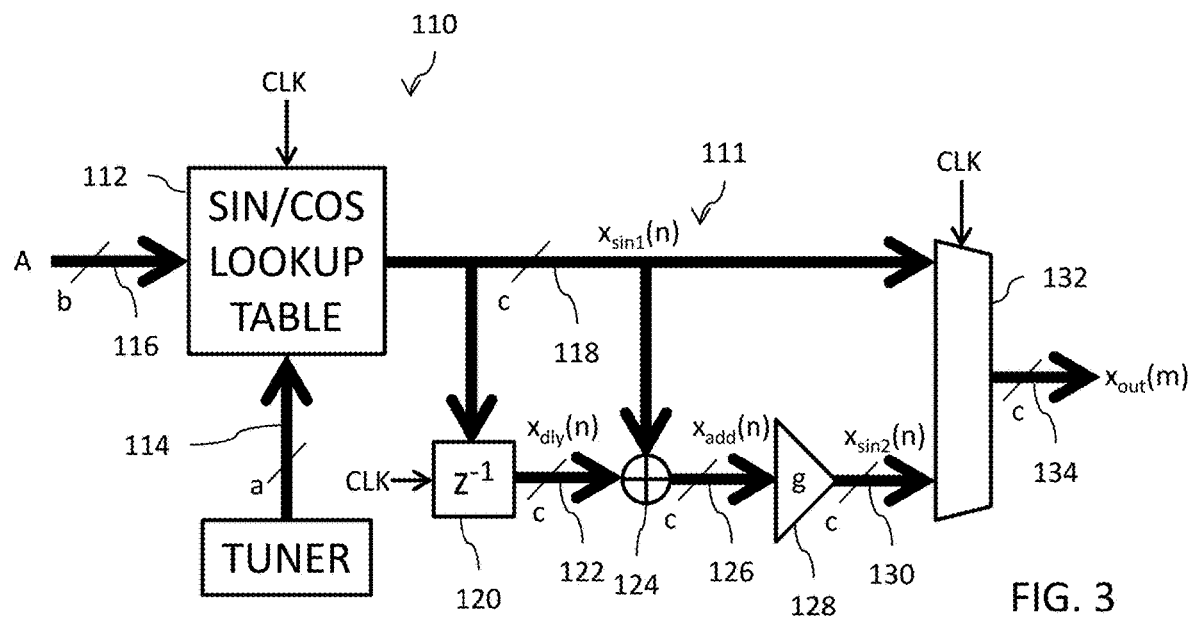
FIG. 3 is a block diagram of a digital sinusoid (sine or cosine) generator in accordance with an embodiment.
Figure 4A:
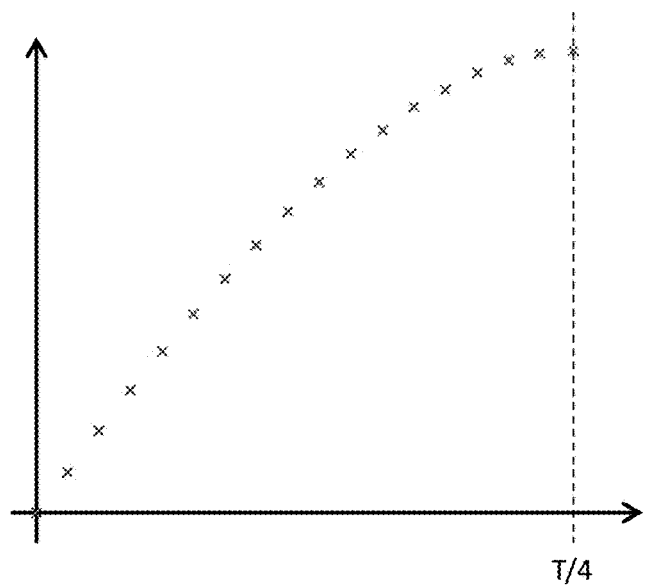
FIGS. 4A, 4C and 4D are sinusoid sample diagrams for signals present in the generator of FIG. 3.

Reference is now made to FIG. 3 which shows a block diagram of a digital sinusoid (sine or cosine) generator 110 for implementing this solution. A sin/cos lookup table (LUT) 112 stores a plurality of digital values which represent discrete samples of the magnitude of a sinusoid having a certain base frequency fb and sampled at a certain sampling frequency fs (see, FIG. 2). The discrete digital values for those samples stored in the sin/cos LUT 112 are accessed for output one at a time at a rate set by a clock signal CLK having a frequency fclk in response to a multi-bit (for example, a-bit) tuning signal 114 and a multi-bit (for example, b-bit) amplitude signal 116 to generate a first digital sinusoid signal 118. The frequency fclk may, in an example implementation, equal the sampling frequency fs. In the discrete domain, the first digital sinusoid signal 116 output from the sin/cos LUT 112 is a multi-bit (for example, c-bit) digital signal of the form: $x_{sin\_1}(n) = A\sin(2\pi nk/N)$, wherein A is the amplitude of the sinusoid selected by amplitude signal 116 set by the tuner, n is the digital signal index for accessing the lookup table, and k is the tuning value provided by the tuning signal 114. A visual representation of the first digital sinusoid signal 116 is shown in FIG. 4A with the samples of the sinusoid indicated by an "x" (noting that FIG. 4A shows samples for only one quarter of the full sinusoid waveform from $0 \rightarrow \pi/2$). In the time domain, this digital sinusoid signal ideally corresponds to $x(t) = A\sin(\omega t)$, which is equal to the first addend of the mathematical relationship Eq. 1 noted above.

The generator 110 further comprises a digital signal processing circuit 111 including a delay circuit 120, an adder circuit 124, a gain scaling circuit 128 and a 2:1 multiplexing (MUX) circuit 132.

The first digital sinusoid signal 118 is input to the delay circuit 120 which is clocked by the clock signal CLK. The delay circuit 120 applies a one sample delay (i.e., a delay equal to one cycle of the clock signal CLK) to the first digital sinusoid signal 118 to generate a delayed digital sinusoid signal 122. In the discrete domain, the delayed digital sinusoid signal 122 output from the delay circuit 120 is a multi-bit (for example, c-bit) digital signal of the form: $x_{dly}(n) = A\sin(2\pi(n-1)k/N)$. In the time domain, this delayed digital sinusoid signal ideally corresponds to $x(t) = A\sin(\omega t + \alpha)$, which is equal to the second addend of the mathematical relationship Eq. 1 noted above. In this case, the phase delay $\alpha$ corresponds to a one sample delay implemented by delay circuit 120 based on the clock signal CLK.

Figure 4B:
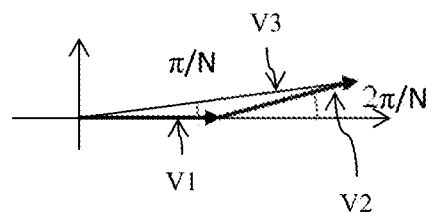
FIG. 4B is a vector phase diagram.

The adder circuit 124 adds the first digital sinusoid signal 118 and the delayed digital sinusoid signal 122 to generate an added digital sinusoid signal 126. In the discrete domain, the added digital sinusoid signal 126 output from the adder circuit 124 is a multi-bit (for example, c-bit) digital signal of the form: $x_{add}(n) = A\sin(2\pi nk/N) + A\sin(2\pi(n-1)k/N) = 2A\cos(\pi/N)\sin(2\pi(n-(1/2))k/N)$. In the time domain, this delayed digital sinusoid signal ideally corresponds to $x(t) = 2A\cos(\alpha/2)\sin(\omega t + \alpha/2)$, which is the sum of the mathematical relationship Eq. 1 noted above. FIG. 4B is a vector phase diagram illustrating this relationship where vector V1 corresponds to signal 118 at a phase of 0, vector V2 corresponds to signal 122 at a phase of $2\pi/N$ and vector V3, which is the sum of V1+V2, corresponds to signal 126 at a phase of $\pi/N$.

Figure 4C:
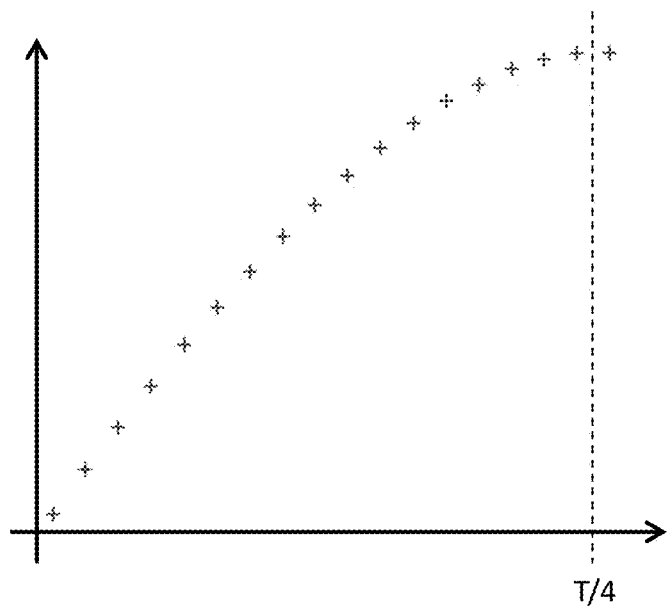

The term $2\cos(\pi/N) = 2\cos(\alpha/2)$ is a mathematic constant dependent solely on the applied phase shift a set by the one sample delay. The gain scaling circuit 128 can then be used to mathematically apply a gain scaling value g, where $g = 1/(2\cos(\pi/N))$, to the added digital sinusoid signal 126 in order to cancel the constant and generate a second digital sinusoid signal 130. In the discrete domain, the second digital sinusoid signal 130 output from the gain scaling circuit 128 is a multi-bit (for example, c-bit) digital signal of the form: $x_{sin\_2}(n) = A\sin(2\pi(n-(1/2))k/N)$. A visual representation of the second digital sinusoid signal 130 is shown in FIG. 4C with the samples of the sinusoid indicated by a "+" (where FIG. 4C shows samples for only one quarter of the full sinusoid waveform from $0 \rightarrow \pi/2$). In the time domain, this second digital sinusoid signal ideally corresponds to $x(t)=A \sin(\omega t+\alpha/2)$, which is equal to the output term of the mathematical scaling operation Eq. 2 noted above.

Figure 4D:
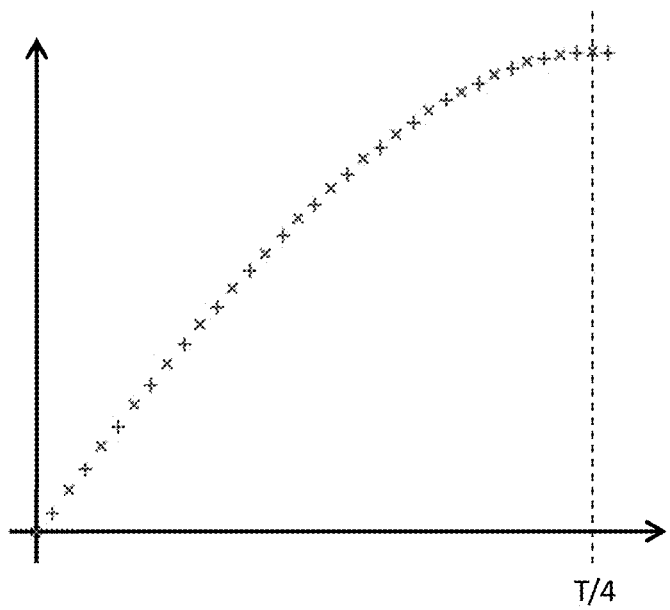

In this case, the phase shift $\alpha/2$ term of $A \sin(\omega t+\alpha/2)$ corresponds to one-half of the sample delay provided by the delay circuit 120 based on the clock signal CLK. This is important because it places the individual samples of the second digital sinusoid signal $x_{sin\ 2}(n)$ between consecutive samples of the first digital sinusoid signal $x_{sin\ 1}(n)$. A visual representation of this is shown in FIG. 4D with the samples of the first digital sinusoid indicated by an "x" (see, also FIG. 4A) and samples of the second digital sinusoid indicated by a "+" (noting again that FIG. 4D shows samples for only one quarter of the full sinusoid waveform from $0 \to \pi/2$).

The first digital sinusoid signal $x_{sin\ 1}(n)$ and the second digital sinusoid signal $x_{sin\ 2}(n)$ are provided as inputs to the 2:1 multiplexing (MUX) circuit 132. The selection input of the MUX circuit 132 receives the clock signal CLK. The MUX circuit 132 accordingly operates to pass samples of the first digital sinusoid signal $x_{sin\ 1}(n)$ (the "x" samples as shown in FIG. 4A) when the clock signal has a first (for example, low) logic state and the further operates to pass samples of the second digital sinusoid signal $x_{sin\ 2}(n)$ (the "+" samples as shown in FIG. 4B) when the clock signal has a second (for example, high) logic state. An output digital sinusoid signal 134 is produced at the output of the MUX circuit 132 and formed from the repeated and alternate selection of samples from the first and second digital sinusoid signals. In the discrete domain, the output digital sinusoid signal 134 is a multi-bit (for example, c-bit) digital signal of the form: $x_{out}(m)=A \sin(2\pi(n-1)k/2N)=A \sin(\pi(n-1)k/N)$; wherein the "2N" term indicates that two times the number of samples N are available for each period of the sinusoid (as shown in FIG. 4D).

The circuit 110 requires only the inclusion of delay, addition and multiplication (gain scaling) operations using the digital signal processing circuit 111 in order to process the digital sinusoid signal output from the sin/cos LUT 112 and double the available frequency resolution by generating twice as many samples. This is accomplished without any increase in the number of samples N stored in the sin/cos LUT 112 itself and without any increase in the size of the memory for the sin/cos LUT 112.

Figure 5:
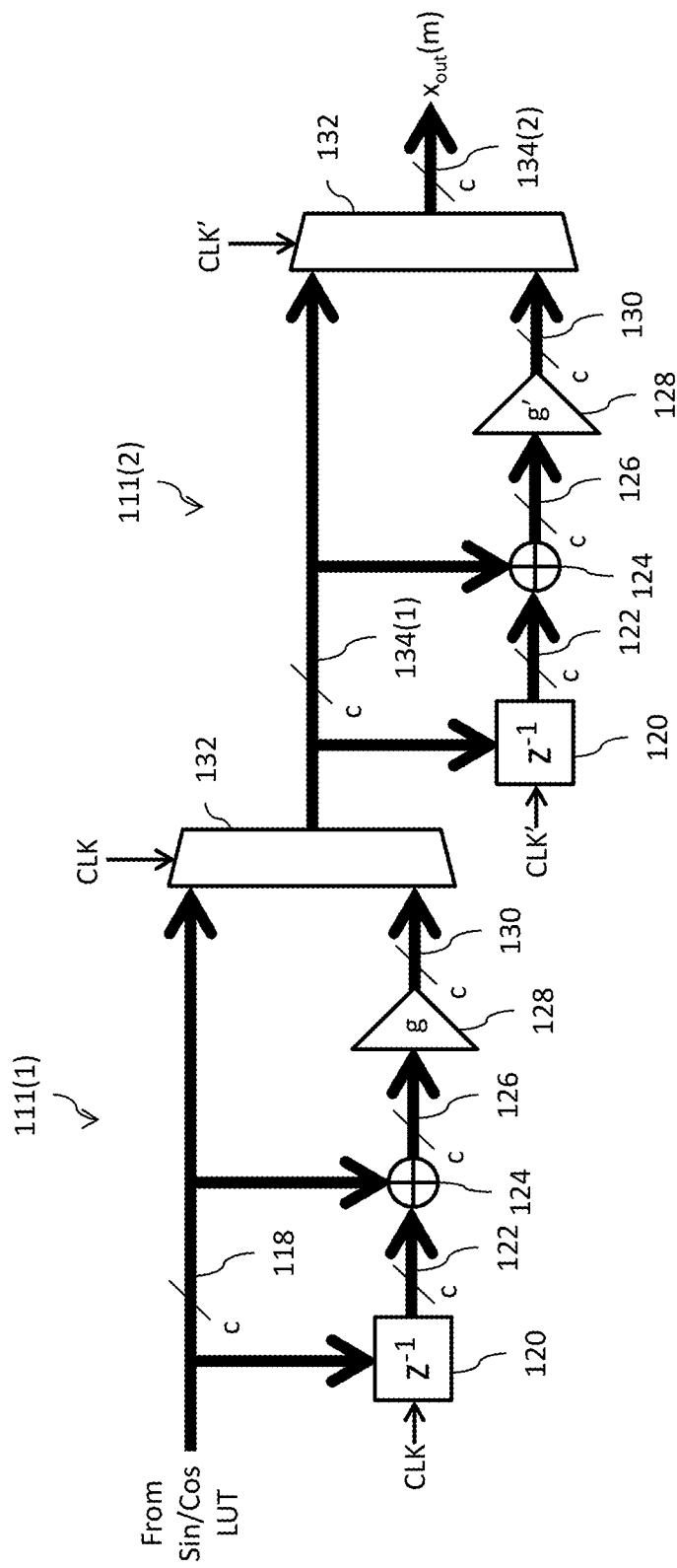
FIG. 5 is a block diagram of a digital sinusoid (sine or cosine) generator in accordance with another embodiment.

The digital signal processing circuitry 111 of the circuit 110 can be cascaded to enable a further doubling of the frequency resolution. An example of such a cascaded circuit configuration is shown in FIG. 5. The digital sinusoid signal 134(1) output from the first stage digital signal processing circuitry 111(1) is applied to the input of the second stage digital signal processing circuitry 111(2) which generates a digital sinusoid signal 134(2). Because the first stage digital signal processing circuitry 111(1) is generating twice as many samples in response to the positive and negative phases of the clock signal CLK, the second stage digital signal processing circuitry 111(2) must operate with a clock signal CLK' having a frequency that is two times the frequency of the clock signal CLK. Any suitable clock doubling circuit can generate the clock CLK'. Alternatively, a suitable clock tree circuit can be used to generate the two clock signals CLK and CLK' at different frequencies. Additionally, because of the increased frequency resolution from the first stage and the increased rate at which those samples are being output from the first stage, the gain scaling circuit 128 in the second stage must apply a gain scaling value g', where $g'=1/(2 \cos(\pi/2N))$. In the discrete domain, the output digital sinusoid signal 134(2) from the second stage is a multi-bit (for example, c-bit) digital signal of the form: $x_{out}(m)=A \sin(2\pi(n-1)k/4N)=A \sin(\pi(n-1)k/2N)$; wherein the "4N" term indicates that four times the number of samples N as provided by the sin/cos LUT 112 are available.

Figure 6:
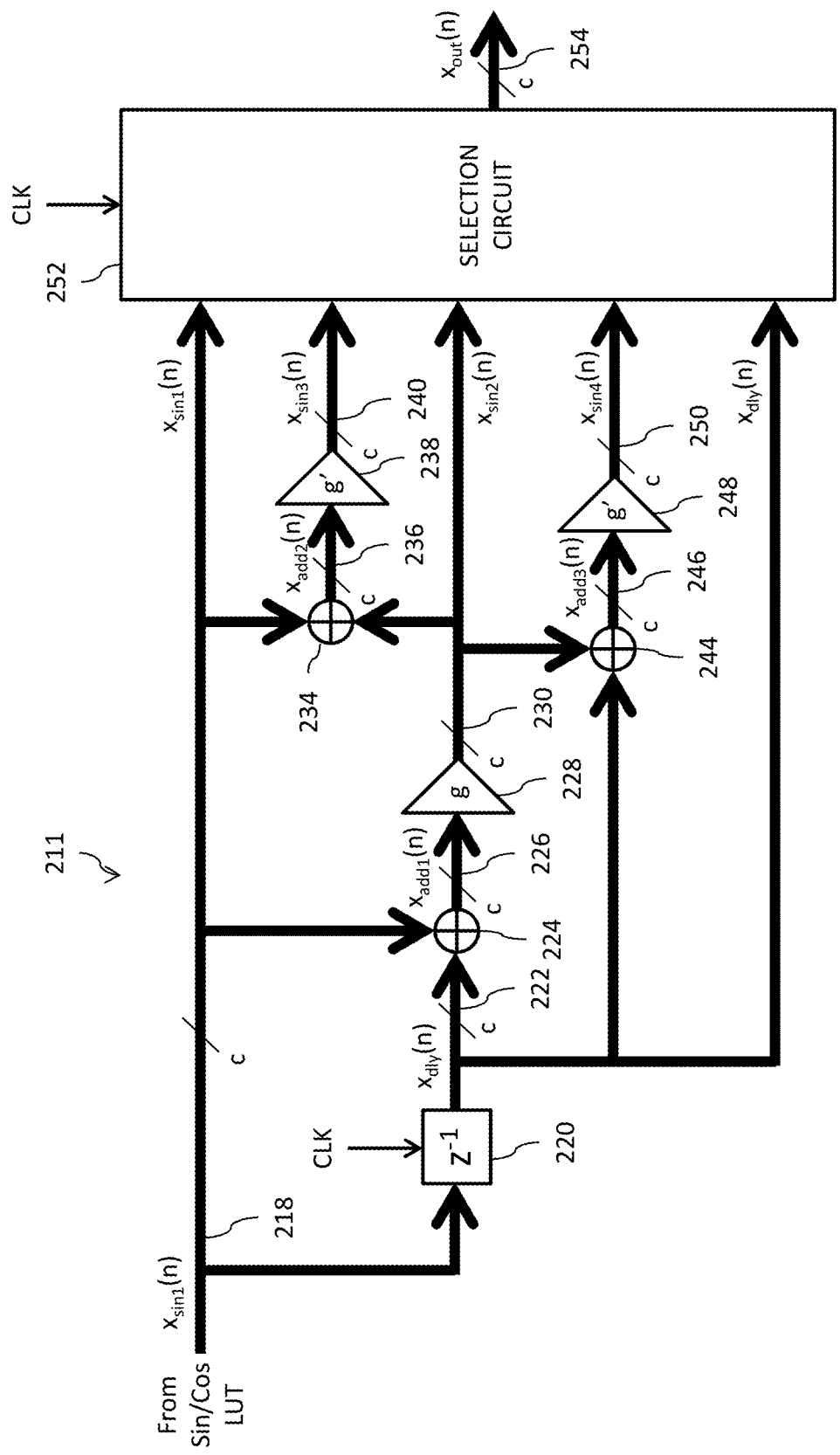
FIG. 6 is a block diagram of a digital sinusoid (sine or cosine) generator in accordance with another embodiment.

Reference is now made to FIG. 6 which shows a block diagram of digital signal processing circuit 211 for a digital sinusoid (sine or cosine) generator in accordance with another embodiment. This embodiment, like the embodiment of FIG. 5, supports a further doubling of the frequency resolution in comparison to the embodiment of FIG. 3. However, only the single frequency clock CLK is needed.

The discrete digital values which represent discrete samples of the magnitude of a sinusoid having a certain base frequency fb and sampled at a certain sampling frequency fs (see, FIG. 2) are received from the sin/cos LUT as a first digital sinusoid signal 218 at a rate set by a clock signal CLK having a frequency fclk. In the discrete domain, the first digital sinusoid signal 218 is a multi-bit (for example, c-bit) digital signal of the form: $x_{sin\ 1}(n)=A \sin(2\pi nk/N)$. The first digital sinusoid signal 218 is input to the delay circuit 220 which is clocked by the clock signal CLK. The delay circuit 220 applies a one sample delay (i.e., a delay equal to one cycle of the clock signal CLK) to the first digital sinusoid signal 218 to generate a delayed digital sinusoid signal 222. In the discrete domain, the delayed digital sinusoid signal 222 output from the delay circuit 220 is a multi-bit (for example, c-bit) digital signal of the form: $x_{dly}(n)=A \sin(2\pi(n-1)k/N)$.

A first adder circuit 224 adds the first digital sinusoid signal 218 and the delayed digital sinusoid signal 222 to generate a first added digital sinusoid signal 226. In the discrete domain, the first added digital sinusoid signal 226 output from the adder circuit 224 is a multi-bit (for example, c-bit) digital signal of the form: $x_{add1}(n)=A \sin(2\pi nk/N)+A \sin(2\pi(n-1)k/N)=2A \cos(\pi/N)\sin(2\pi(n-(½))k/N)$.

The term $2 \cos(\pi/N)$ is a mathematic constant dependent solely on the applied phase shift set by the one sample delay. A first gain scaling circuit 228 can then be used to mathematically apply a gain scaling value g, where $g=1/(2 \cos(\pi/N))$, to the added digital sinusoid signal 226 in order to cancel the constant and generate a second digital sinusoid signal 230. In the discrete domain, the second digital sinusoid signal 230 output from the gain scaling circuit 228 is a multi-bit (for example, c-bit) digital signal of the form: $x_{sin\ 2}(n)=A \sin(2\pi(n-(½))k/N)$.

A second adder circuit 234 adds the first digital sinusoid signal 218 and the second sinusoid signal 230 to generate a second added digital sinusoid signal 236. In the discrete domain, the second added digital sinusoid signal 236 output from the second adder circuit 234 is a multi-bit (for example, c-bit) digital signal of the form: $x_{add2}(n)=A \sin(2\pi nk/N)+A \sin(2\pi(n-(½))k/N)=2A \cos(\pi/2N)\sin(2\pi(n-(¼))k/N)$.

The term $2 \cos(\pi/2N)$ is a mathematic constant dependent solely on the applied phase shift set by the one sample delay. A second gain scaling circuit 238 can then be used to mathematically apply a gain scaling value g', where $g'=1/(2 \cos(\pi/2N))$, to the second added digital sinusoid signal 236 in order to cancel the constant and generate a third digital sinusoid signal 240. In the discrete domain, the third digital sinusoid signal 240 output from the gain scaling circuit 238 is a multi-bit (for example, c-bit) digital signal of the form: $x_{sin\ 3}(n)=A \sin(2\pi(n-(¼))k/N)$.

A third adder circuit 244 adds the delayed digital sinusoid signal 222 and the second sinusoid signal 230 to generate a third added digital sinusoid signal 246. In the discrete domain, the third added digital sinusoid signal 246 output from the third adder circuit 244 is a multi-bit (for example, c-bit) digital signal of the form: $x_{add3}(n)=A \sin(2\pi(n-1)k/N)+A \sin(2\pi(n-\frac{1}{2})k/N)=2A \cos(\pi/2N)\sin(2\pi(n-\frac{3}{4})k/N)$.

The term $2\cos(\pi/2N)$ is a mathematic constant dependent solely on the applied phase shift set by the one sample delay. A third gain scaling circuit 248 can then be used to mathematically apply a gain scaling value g', where $g'=1/(2\cos(\pi/2N))$, to the third added digital sinusoid signal 246 in order to cancel the constant and generate a fourth digital sinusoid signal 250. In the discrete domain, the fourth digital sinusoid signal 250 output from the gain scaling circuit 248 is a multi-bit (for example, c-bit) digital signal of the form: $x_{sin\ 4}(n)=A \sin(2\pi(n-\frac{3}{4})k/N)$.

A selection circuit 252 clocked by the clock signal CLK is then used to repeatedly and sequentially select samples from among the delayed digital sinusoid signal 222 ($x_{dly}(n)$) and the first, second, third and fourth digital sinusoid signals ($x_{sin\ 1}(n)$ to $x_{sin\ 4}(n)$) to generate output digital sinusoid signal 254. In the discrete domain, the output digital sinusoid signal 254 is a multi-bit (for example, c-bit) digital signal of the form: $x_{out}(m)=A \sin(2\pi(n-1)k/4N)$; wherein the "4N" term indicates that four times the number of samples N are available for each period of the sinusoid.

In an example embodiment, the selection circuit 252 may comprise a 4:1 multiplexer circuit receiving the first, second, third and fourth digital sinusoid signals ($x_{sin\ 1}(n)$ to $x_{sin\ 4}(n)$) as inputs. The selection input of this 4:1 multiplexer circuit receives the clock signal CLK and the clock signal phase shifted by ninety degrees CLK90. The multiplexer circuit operates to pass samples of the fourth digital sinusoid signal $x_{sin\ 4}(n)$ when the clock signal CLK has a first (for example, low) logic state and the phase shifted clock signal CLK90 also has the first logic state. Samples of the second digital sinusoid signal $x_{sin\ 2}(n)$ are passed by the multiplexer circuit when the clock signal CLK has a second (for example, high) logic state and the phase shifted clock signal CLK90 has the first logic state. When the clock signal CLK has the second logic state and the phase shifted clock signal CLK90 also has the second logic state, the multiplexer circuit passes samples the third digital sinusoid signal $x_{sin\ 3}(n)$. Lastly, samples of the first digital sinusoid signal $x_{sin\ 1}(n)$ are passed by the multiplexer circuit when the clock signal CLK has the first logic state and the phase shifted clock signal CLK90 has the second logic state.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A digital circuit, comprising:
   an input configured to receive a first digital sinusoid signal;
   a first delay circuit configured to apply a delay to the first digital sinusoid signal to generate a first delayed digital sinusoid signal;
   a first adder circuit configured to add the first digital sinusoid signal to the first delayed digital sinusoid signal to generate a first added digital sinusoid signal;
   a first gain scaling circuit configured to apply a first scaling factor to the first added digital sinusoid signal to generate a second digital sinusoid signal; and
   a selection circuit configured to repeatedly select samples from both the first and second digital sinusoid signals and generate an output digital sinusoid signal.

2. The digital circuit of claim 1, wherein the selection circuit comprises a first multiplexing circuit configured to alternately select samples from the first and second digital sinusoid signals for output as the output digital sinusoid signal.

3. The digital circuit of claim 2, wherein said first multiplexing circuit alternately selects at a rate which is two times a rate at which samples of the first digital sinusoid signal are received.

4. The digital circuit of claim 1, wherein said first delay circuit applies a one sample delay to the first digital sinusoid signal.

5. The digital circuit of claim 1, wherein the delay applied by the first delay circuit provides a first phase shift between the first digital sinusoid signal and the first delayed digital sinusoid signal, and wherein a second phase shift equal to one half of the first phase shift exists between the first digital sinusoid signal and the second digital sinusoid signal.

6. The digital circuit of claim 5, wherein the first digital sinusoid signal has N samples in one sinusoid period and wherein the first phase shift is equal to $2\pi/N$ and the second phase shift is equal to $\pi/N$.

7. The digital circuit of claim 6, wherein the first gain is a function of a cosine of $\pi/N$.

8. The digital circuit of claim 1, wherein the first gain is a function of a cosine of a phase angle of the delay applied by the first delay circuit.

9. The digital circuit of claim 1, further comprising:
   a second delay circuit configured to apply a delay to the output digital sinusoid signal to generate a second delayed digital sinusoid signal;
   a second adder circuit configured to add the output digital sinusoid signal to the second delayed digital sinusoid signal to generate a second added digital sinusoid signal;
   a second gain scaling circuit configured to apply a second scaling factor to the second added digital sinusoid signal to generate a third digital sinusoid signal; and
   a further selection circuit configured to repeatedly select samples from both the output and third digital sinusoid signals and generate a further output digital sinusoid signal.

10. The digital circuit of claim 9, wherein the further selection circuit comprises a second multiplexing circuit configured to alternately select samples from the output and third digital sinusoid signals for output as the further output digital sinusoid signal.

11. The digital circuit of claim 9, wherein said second delay circuit applies a one sample delay to the output digital sinusoid signal.

12. The digital circuit of claim 9, wherein the delay applied by the second delay circuit provides a third phase shift between the output digital sinusoid signal and the second delayed digital sinusoid signal, and wherein a fourth phase shift equal to one half of the third phase shift exists between the output digital sinusoid signal and the third digital sinusoid signal.

13. The digital circuit of claim 12, wherein the first digital sinusoid signal has N samples in one sinusoid period, wherein the output digital sinusoid signal has 2N samples in said one sinusoid period, and wherein the third phase shift is equal to $4\pi/N$ and the fourth phase shift is equal to $2\pi/N$.

14. The digital circuit of claim 13, wherein the second gain is a function of a cosine of $\pi/2N$.

15. The digital circuit of claim 9, wherein the second gain is a function of a cosine of a phase angle of the delay applied by the second delay circuit.

16. The digital circuit of claim 1, further comprising:
a second adder circuit configured to add the first digital sinusoid signal to the second digital sinusoid signal to generate a second added digital sinusoid signal;
a second gain scaling circuit configured to apply a second scaling factor to the second added digital sinusoid signal to generate a third digital sinusoid signal;
a third adder circuit configured to add the second digital sinusoid signal to the first delayed digital sinusoid signal to generate a third added digital sinusoid signal; and
a third gain scaling circuit configured to apply a third scaling factor to the third added digital sinusoid signal to generate a fourth digital sinusoid signal;
wherein said selection circuit is configured to repeatedly select samples from all of the first, second, third and fourth digital sinusoid signals and generate the output digital sinusoid signal.

17. The digital circuit of claim 16, wherein the second and third scaling factors are equal.

18. The digital circuit of claim 16, wherein the selection circuit comprises a first multiplexing circuit configured to sequentially select samples from the first through fourth digital sinusoid signals for output as the output digital sinusoid signal.

19. The digital circuit of claim 18, wherein said first multiplexing circuit sequentially selects at a rate which is four times a rate at which samples of the first digital sinusoid signal are received.

20. The digital circuit of claim 1, wherein the first digital sinusoid signal is supplied by a sinusoid lookup table (LUT).

21. The digital circuit of claim 20, wherein the first digital sinusoid signal has samples and wherein said LUT outputs the samples at a rate set by a clock signal.

22. The digital circuit of claim 21, wherein the first delay circuit is clocked by said clock signal.

23. The digital circuit of claim 21, wherein the repeated selection of samples from the first, second, third and fourth digital sinusoid signals is made in response to said clock signal.

24. The digital circuit of claim 21, wherein the first digital sinusoid signal has N samples in one sinusoid period, and further comprising a tuning circuit configured to generate a control signal for selecting said N samples from the LUT.

25. The digital circuit of claim 1, wherein the digital signal processing circuit is a digital sinusoid generator.

26. A sinusoid generator circuit, comprising:
an input configured to receive a first digital sinusoid signal having a time domain representation corresponding to $A \sin(\omega t)$;
a processing circuit coupled to said input and configured to generate from said first digital sinusoid signal a second digital sinusoid having a time domain representation corresponding to $A \sin(\omega t + \alpha/2)$;
wherein $\alpha$ is a phase shift equal to one sample of the first digital sinusoid signal; and
a selection circuit having first and second inputs configured to receive the first and second digital sinusoid signals, respectively, said multiplexer circuit configured to repeatedly and sequentially select samples of the first and second digital sinusoid signals to generate a third digital sinusoid signal.

27. The sinusoid generator circuit of claim 26, wherein said processing circuit is configured to process the first and second digital sinusoid signals to implement, expressed in the time domain, the following mathematical expression:

$$\frac{A\sin(\omega t) + A\sin(\omega t + \alpha)}{2\cos(\alpha/2)}.$$

28. The sinusoid generator circuit of claim 26, wherein said processing circuit comprises:
a delay circuit for delaying the first digital sinusoid signal by one sample;
an adder circuit configured to add the first digital sinusoid signal to an output of the delay circuit; and
a gain scaling circuit configured to scale an output of the adder circuit by a scaling factor as a function of 2 $\cos(\alpha/2)$.

29. A sinusoid generator circuit, comprising:
an input configured to receive a first digital sinusoid signal having a discrete domain representation of $A \sin(2\pi n/N)$, where n is an index for samples and N is a total number of samples in one sinusoid period;
a processing circuit coupled to said input and configured to generate from said first digital sinusoid signal a second digital sinusoid having a discrete domain representation corresponding to $A \sin(2\pi(n-(\frac{1}{2}))/N)$; and
a selection circuit having first and second inputs configured to receive the first and second digital sinusoid signals, respectively, said multiplexer circuit configured to repeatedly and sequentially select samples of the first and second digital sinusoid signals to generate a third digital sinusoid signal.

30. The sinusoid generator circuit of claim 29, wherein said processing circuit is configured to process the first and second digital sinusoid signals to implement, expressed in the discrete domain, the following mathematical expression:

$$\frac{A\sin(2\pi n/N) + A\sin(2\pi(n-1)/N)}{2\cos(\pi/N)}.$$

31. The sinusoid generator circuit of claim 29, wherein said processing circuit comprises:
a delay circuit for delaying the first digital sinusoid signal by one sample;
an adder circuit configured to add the first digital sinusoid signal to an output of the delay circuit; and
a gain scaling circuit configured to scale an output of the adder circuit by a scaling factor as a function of 2 $\cos(\pi/N)$.

32. The method of claim 31, wherein delaying comprises applying a first phase shift between the first digital sinusoid signal and the delayed digital sinusoid signal, and wherein a second phase shift equal to one half of the first phase shift exists between the first digital sinusoid signal and the third digital sinusoid signal.

33. The method of claim 32, wherein the first digital sinusoid signal has N samples in one sinusoid period and wherein the first phase shift is equal to $2\pi/N$ and the second phase shift is equal to $\pi/N$.

34. The method of claim 33, wherein the scaling factor is a function of a cosine of $\pi/N$.

35. A method, comprising:
receiving a first digital sinusoid signal;
delaying the first digital sinusoid signal to produce a delayed digital sinusoid signal;

adding the first digital sinusoid signal to the delayed digital sinusoid signal to generate an added digital sinusoid signal;

apply a scaling factor to the added digital sinusoid signal to generate a second digital sinusoid signal; and repeatedly and sequentially selecting samples from the first and second digital sinusoid signals to generate a third digital sinusoid signal.

36. The method of claim 35, wherein selecting is performed at a rate which is two times a rate at which samples of the first digital sinusoid signal are received.

37. The method of claim 35, wherein delaying comprises delaying by one sample.

38. The method of claim 35, wherein the scaling factor is a function of a cosine of a phase angle of a delay resulting from delaying the first digital sinusoid signal.

\* \* \* \* \*